United States Patent [19]

Marshall et al.

[11] Patent Number: 5,737,190
[45] Date of Patent: Apr. 7, 1998

[54] DIGITAL INPUT/OUTPUT CIRCUIT BOARD

[75] Inventors: Arthur James Marshall, Gettysburg; John Anthony Ecton, Jr., Greencastle, both of Pa.

[73] Assignee: Frick York International, Waynesboro, Pa.

[21] Appl. No.: 521,182

[22] Filed: Aug. 30, 1995

[51] Int. Cl.[6] .................................................. H05K 1/14
[52] U.S. Cl. ............................ 361/760; 361/686; 361/679; 361/728; 361/729; 361/833; 361/834; 439/59; 439/65
[58] Field of Search .......................... 361/777, 686, 361/729, 728, 833, 834, 731, 733, 760; 439/341, 59, 157, 65

[56] References Cited

U.S. PATENT DOCUMENTS

4,504,927  3/1985  Callan ..................................... 364/900
4,790,762  12/1988  Harms et al. ............................... 439/59

*Primary Examiner*—Leo P. Picard
*Assistant Examiner*—David Foster
*Attorney, Agent, or Firm*—Dowell & Dowell

[57] ABSTRACT

A digital input/output circuit board includes a plurality of module receptacles for selectively mounting input modules or output modules, wiring terminals for attaching field wires to electrically connect the circuit board to field devices, a hot wiring terminal for attaching a hot power wire, a neutral wiring terminal for attaching a neutral power wire, and a device for selecting the status of each of the module receptacles as either an input or an output, to enable a computer connected to the circuit board to receive input signals to read the state of the field devices and to send output signals to activate other field devices.

12 Claims, 7 Drawing Sheets

DIGITAL INPUT/OUTPUT CIRCUIT BOARD

BACKGROUND OF THE INVENTION

1. Field of the Invention

The invention relates generally to the field of circuit boards and, more particularly, to a digital input/output circuit board.

2. Discussion of the Related Art

Solid state input/output (I/O) systems are known for converting 5 volt DC switching signals internal to a microprocessor or computer to 120 volt AC switching signals. Such I/O systems enable a microprocessor or computer to receive input signals indicating the state of 120 volt switches via input modules, and to send output signals to activate external 120 volt devices via output modules. The known I/O systems enable microprocessors and computers to be utilized to control various devices in household and industrial settings.

The known I/O systems typically include a base circuit board having a plurality of receptacles for mounting input and output modules, a connector for interfacing to a computer or microprocessor, a terminal strip for attaching field wires to field devices, and a fuse associated with each module. The base circuit boards conventionally have from one to thirty-two or more receptacles for mounting a selected number of modules. An input or an output module may be plugged into any given receptacle position on a circuit board.

The known I/O circuit boards have a number of associated problems and disadvantages. First, the microprocessor or computer must have information as to whether a particular module position on the circuit board is occupied by an input or an output module. Accordingly, whenever the status of a module position changes, the microprocessor or computer information must be updated.

Secondly, the terminal strip must be wired for the proper configuration of each input or output module. Companies which manufacture large numbers of microprocessor or computer controlled equipment utilizing I/O module systems incur substantial labor costs related to the wiring of the terminal strips. I/O boards having a large number of modules require extensive wiring on the terminal strip to configure the modules. Moreover, if a design change is made which requires the status of multiple module positions to be changed from input to output or vice versa, the terminal strip must be rewired in a time-consuming and tedious process.

SUMMARY OF THE INVENTION

The present invention has been made in view of the above-described problems of the known I/O circuit boards and has as an object to provide a digital input/output circuit board which reduces manual wiring time and expenses.

Another object of the present invention is to provide a digital I/O circuit board which provides flexibility of module selection and configuration.

Yet another object of the present invention is to provide a digital I/O circuit board which complies with UL and CSA specifications.

Still another object of the present invention is to provide a digital I/O circuit board which reduces reconfiguration time and expenses.

Additional objects and advantages of the present invention will become apparent from the detailed description which follows and the accompanying drawings. To achieve the objects of the invention, as embodied and broadly described herein, the digital input/output circuit board in accordance with a preferred embodiment of the invention comprises a plurality of module receptacles for selectively mounting input modules or output modules. The module receptacles are electrically connectible to a computer. A plurality of wiring terminals are provided for attaching field wires to electrically connect the circuit board to field devices. The field devices may be devices from which an input signal is sent to the computer to indicate their state, or devices to which an output signal is sent from the computer to cause their activation.

The circuit board further comprises a hot wiring terminal for attaching a hot power wire, and a neutral wiring terminal for attaching a neutral power wire.

Means are further provided on the circuit board for selecting the status of each of the module receptacles as being either an input or an output, depending on the type of module mounted thereto.

A method of connecting a computer and a digital I/O circuit board in accordance with the invention to field devices is also disclosed herein.

DETAILED DESCRIPTION OF THE PREFERRED EMBODIMENT

The preferred embodiment of the invention will now be described in detail with reference to the drawing figures in which common reference numbers identify common elements.

Figure 1:
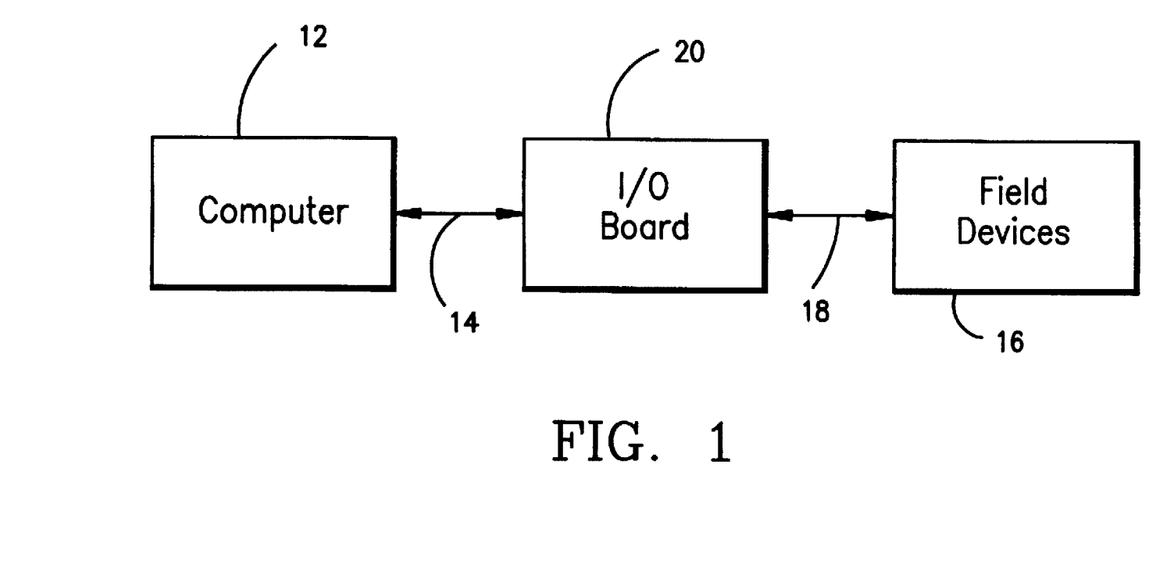
FIG. 1 is an illustrational flow diagram of the general manner of use and operation of the I/O circuit board in accordance with the invention.

FIG. 1 is a flow diagram of the general manner of use of a conventional I/O circuit board 20 and also the I/O circuit board in accordance with the present invention. As shown, the circuit board 20 is electrically connected to a computer 12 via a connector 14 and to one or more field devices 16 via field wiring 18. The computer receives input return signals from the field devices indicating their present state, and sends output signals to other field devices referred to herein as "loads" to activate these other devices. For example, the input return signals may be received from electrical switches to indicate an "opened" or a "closed" state, or from other types of devices indicating their operating status as being either "on" or "off". The output signals may be sent from the computer to loads including motors, solenoids, contactors and the like, to activate contacts and energize the devices.

Figure 2:
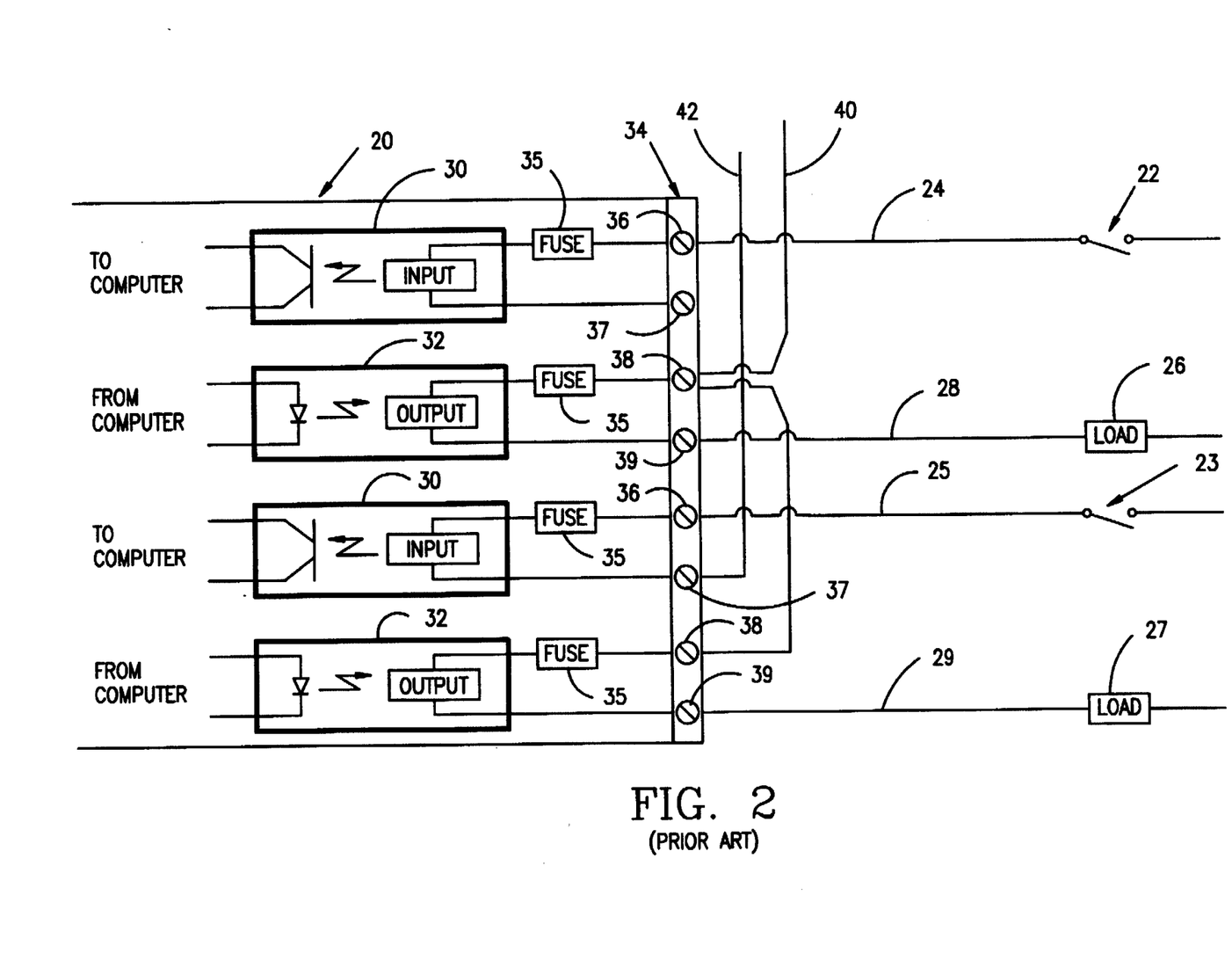
FIG. 2 is a top plan schematic view of a conventional I/O circuit board on which are mounted a plurality of input and output modules connected to field devices.

FIG. 2 schematically illustrates the electrical connection of the conventional I/O circuit board 20 to a pair of switches 22, 23 via field wiring 24, 25, and to a pair of loads 26, 27 via field wiring 28, 29.

Input modules 30 and output modules 32 are shown removably mounted at spaced locations on the circuit board and being electrically connected to the field devices. The conventional circuit board may have as many as thirty-two locations for mounting modules, and an input or an output module may be mounted at any of the receptacle positions. The input modules 30 are electrically connected to a computer and to the switches 22, 23 to enable the computer to read the state (open or closed) of the switches, and the output modules 32 are electrically connected to the computer and to the loads 26, 27 to enable the computer to send output signals to selectively energize these devices. Any combination of input modules and output modules may be utilized on the circuit board depending on the number of switches or loads connected to the circuit board.

The circuit board 20 further comprises a fuse 35 for each module 30, 32, and a screw terminal strip 34 having a pair of wiring terminals 36, 37 and 38, 39 for each of the modules 30, 32, respectively. The terminal strip is provided for electrically connecting the field wiring to the field switches 22, 23 and loads 26, 27. The terminal strip is wired for the proper configuration of an input or an output. For the input modules 30, field wires 24, 25 connect the respective switches 22, 23 to the terminals 36 associated with the input modules 30. The other terminal 37 for each input module is connected to a neutral power wire 42. For each of the output modules 32, field wires 28, 29 connect the respective loads 26, 27 to the terminals 39 associated with the output modules. The other terminal 38 for the output modules is connected to a hot power wire 40.

Figure 3:
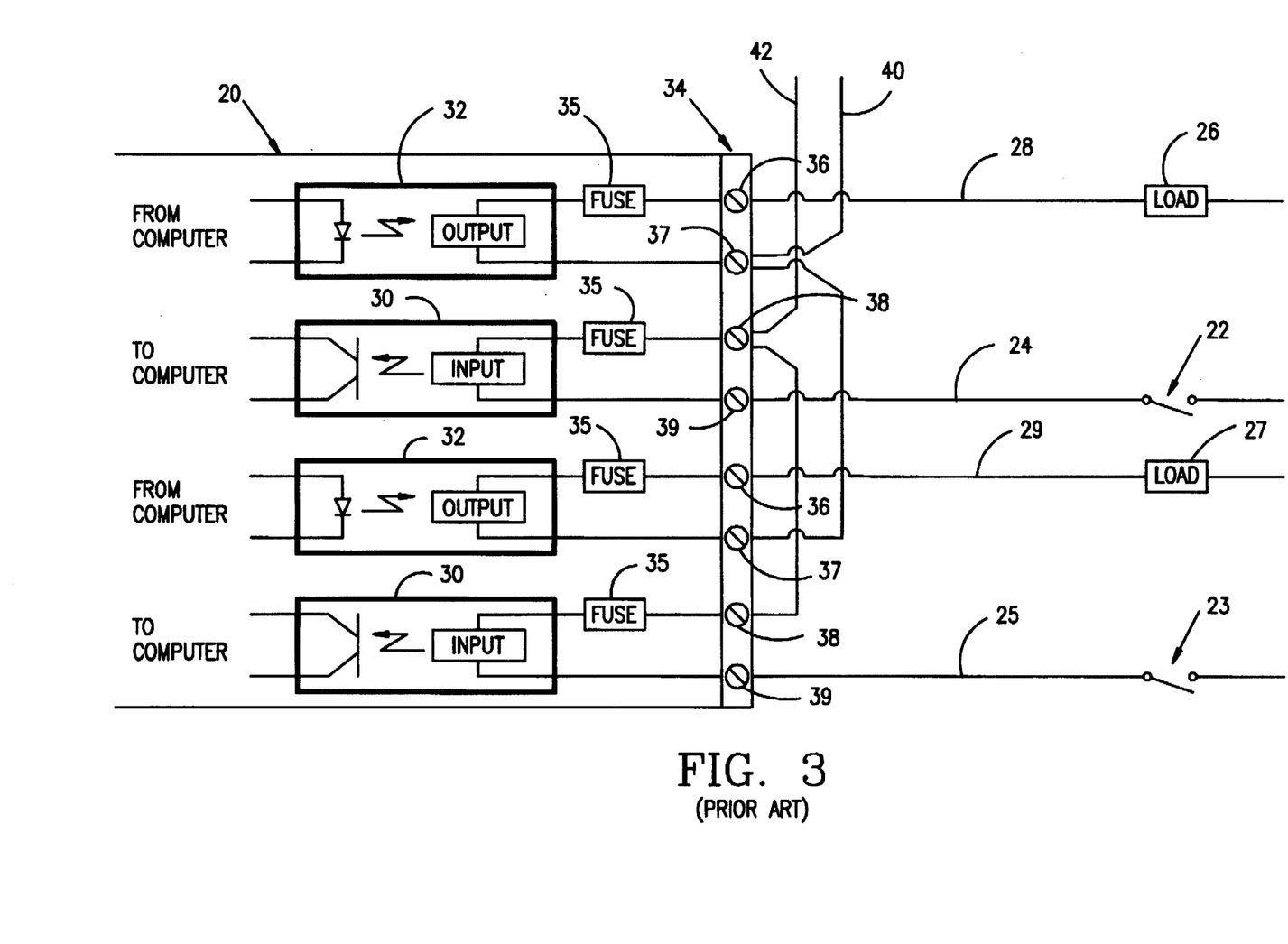
FIG. 3 is a top plan schematic view of the conventional I/O circuit board of FIG. 2 with the modules mounted at reversed positions illustrating the labor intensive wiring changes required for reconfiguration.

FIG. 3 illustrates the conventional I/O circuit board of FIG. 2 electrically connected to the loads 26, 27 and switches 22, 23 arranged at reversed positions. The module arrangement of FIG. 3 is also reversed so that the input modules 30 are connected to the switches and the output modules 32 are connected to the loads. As shown, the reconfiguration of the modules requires significant rewiring of the terminal strip 34 so that the neutral power wire 42 is connected to the input modules 30 and the hot power wire 40 is connected to the output modules 32, and the field wires 24, 25, 28 and 29 are connected to the proper terminals on the terminal strip.

Figure 4:
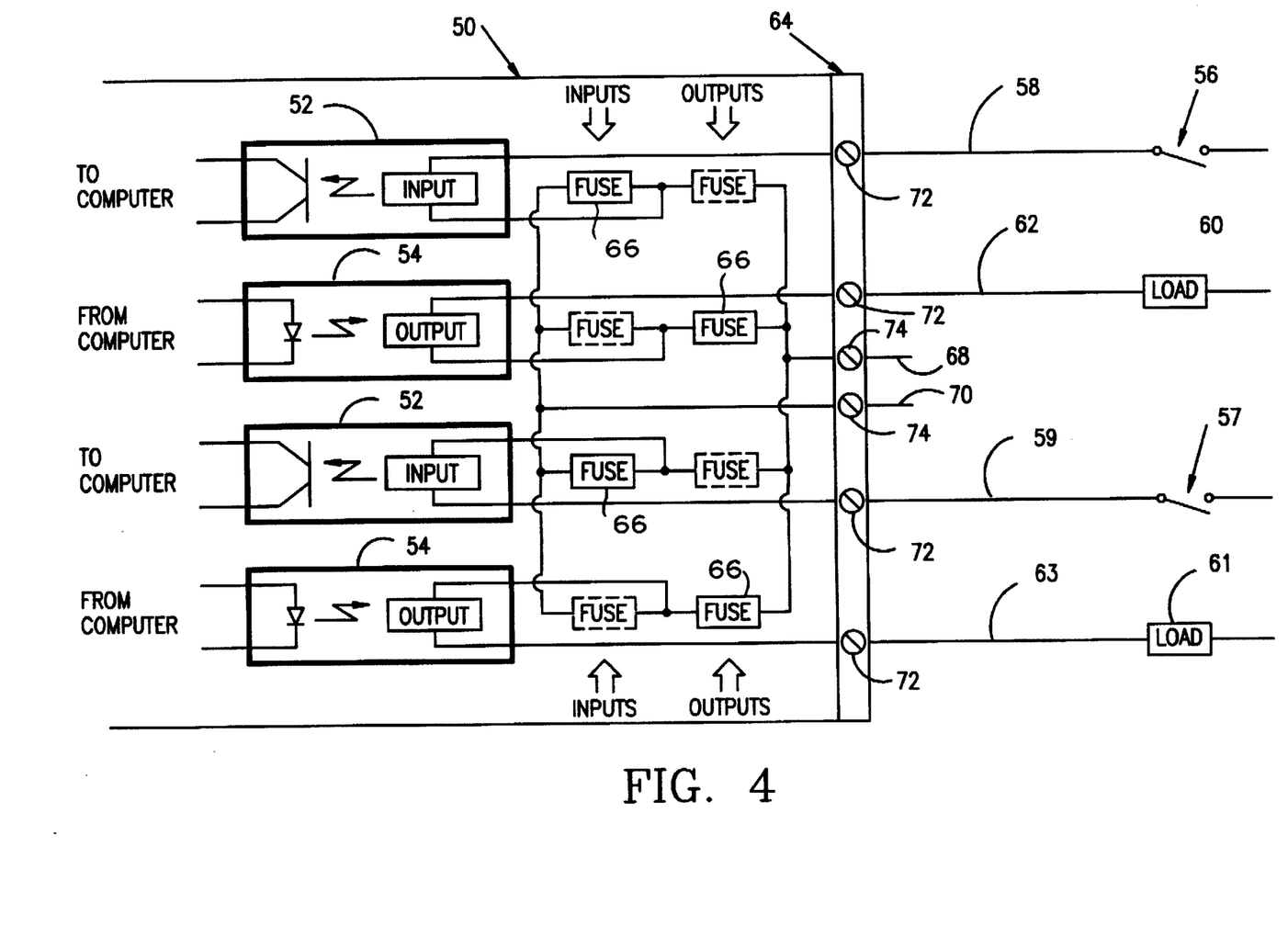
FIG. 4 is a top plan schematic view of an I/O circuit board in accordance with a preferred embodiment of the invention on which are mounted a plurality of input and output modules connected to field devices.

FIG. 4 schematically depicts an I/O circuit board 50 in accordance with a preferred embodiment of the invention. For comparative purposes, the illustrated circuit board comprises two input modules 52 and two output modules 54 as in the conventional circuit board 20 depicted in FIG. 2. The circuit board may optionally have a different number of receptacles for mounting more than one module.

The modules 52, 54 are removably mounted at receptacles (described in greater detail below) on the circuit board and are adapted to be electrically connected to a like number of field devices. The field devices may be loads and devices providing input signals such as switches. An input or an output module may be mounted at any of the receptacles, depending on the number and arrangement of the field devices.

The circuit board 50 is electrically connected to a computer such as shown diagrammatically in FIG. 1 for the conventional I/O circuit board. A microprocessor (not shown) which is polled by the computer is preferably a component of the circuit board 50. The input modules 52 are electrically connected to the computer and to switches 56, 57 via field wiring 58, 59 to enable the computer to receive input signals to read the state of the switches, and the output modules 54 are also electrically connected to the computer and to loads 60, 61 via field wiring 62, 63 to enable the computer to send output signals to selectively activate the loads.

The circuit board 50 integrates the hot and neutral wiring used to configure the input and output modules to reduce the amount of time and labor required to wire the terminal strip 64. In addition, a selecting device is incorporated as an element of the circuit board to provide flexibility and ease of reconfiguring the modules for different arrangements of field devices, and to reduce the number of terminals required for field wiring purposes.

As shown in solid and dotted line in FIG. 4, an insulated fuse 66 is provided for each of the input modules 52 and output modules 54 to function as the selecting device to enable selection for a given module position on the circuit board between an output or a input. The fuse is the preferred selecting device because it is a component of the circuit board wiring and also provides other advantages. The fuse is inexpensive and is an UL/CSA approved device. Being insulated, the fuse provides the safety advantage of eliminating shock hazards. Other types of UL/CSA approved devices such as switches and the like may optionally be used in the circuit board as the selecting device.

As indicated by the bold arrows in FIG. 4, the fuses 66 are each mounted at either an "input" or an "output" position on the circuit board, depending on whether the associated module is an input or an output module. The output modules 54 are connected to the loads 60, 61, and the fuses 66 are mounted at output positions as represented by solid lines. Similarly, the input modules 52 are connected to the switches 56, 57, and the fuses 66 are mounted at input positions as also indicated by solid lines. The hot power wiring 68 and the neutral power wiring 70 are connected to the output modules 54 and the input modules 52, respectively.

The circuit board 50 in accordance with the invention significantly reduces the number of wiring terminals associated with the terminal strip 64. Particularly, there is only one terminal 72 for each module 52, 54 and, additionally, two power terminals 74 for the hot wiring 68 and the neutral wiring 70. Thus, for the four modules there are a total of six terminals as compared to eight terminals in the conventional circuit board shown in FIGS. 2 and 3. For circuit boards having more modules, the reduction in the number of terminals as compared to the conventional circuit boards is even greater. For example, a circuit board in accordance with the invention having sixteen modules (not shown) requires eighteen terminals, while a conventional circuit board having sixteen modules (not shown) requires thirty-two terminals. The reduction in the number of terminals in the present circuit board provides significant time and cost advantages with respect to the reconfiguring of the circuit board for different combinations of field devices.

Figure 5:
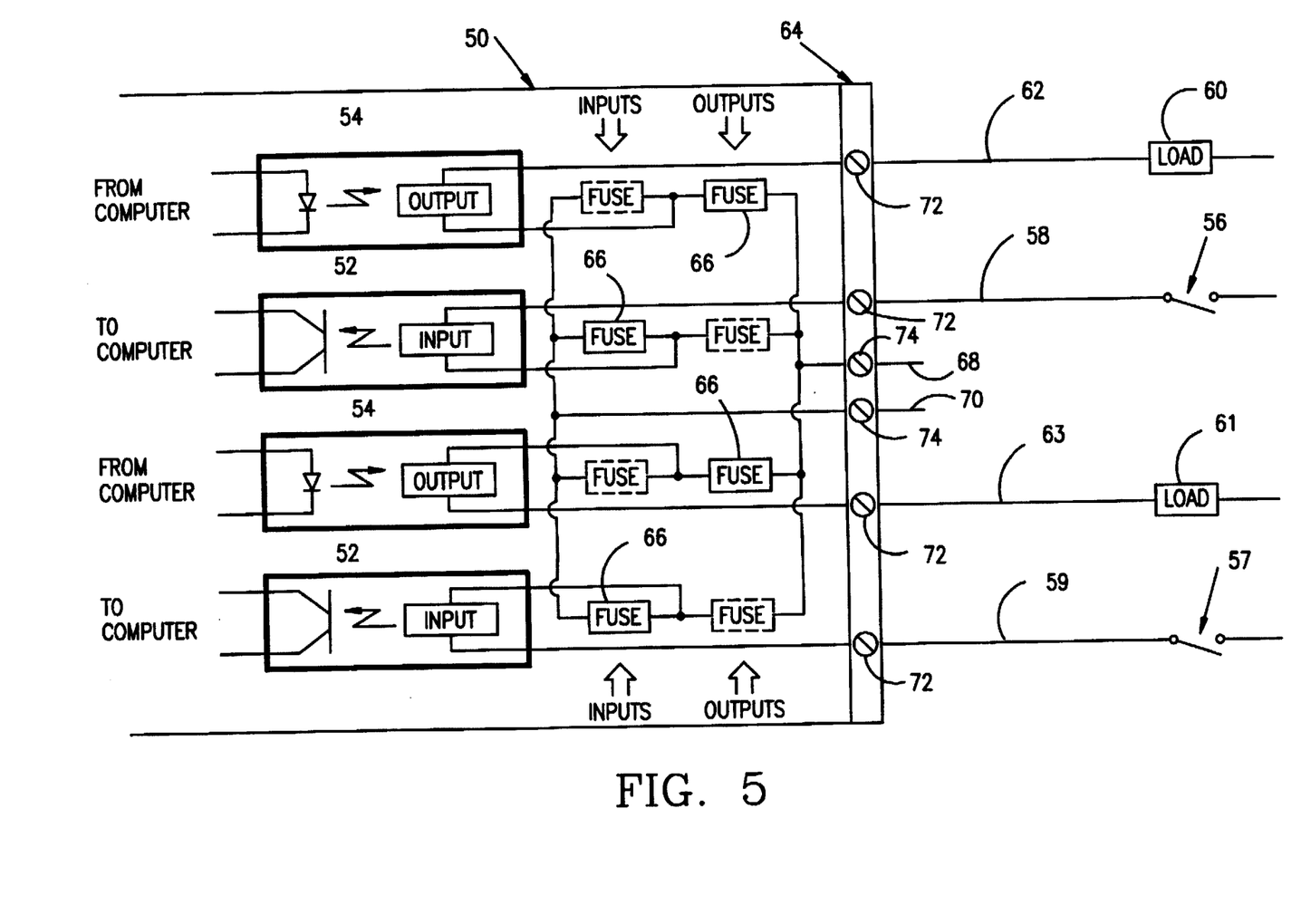
FIG. 5 is a top plan schematic view of the I/O circuit board of FIG. 4 with the modules mounted at reversed positions.

FIG. 5 illustrates the circuit board of FIG. 4 electrically connected to the loads 60, 61 and switches 56, 57 arranged at reversed positions as compared to FIG. 4. The module arrangement of FIG. 5 is also reversed so that input modules 52 are connected to the switches 56, 57, and output modules 54 are connected to the loads 60, 61. As shown, the reconfiguration of the modules requires only the movement of the fuse 66 associated with each module to the opposite input or output position. The hot 68 and neutral wiring 70 is automatically connected without having to configure the modules manually through the terminal 64.

The circuit board 50 in accordance with the invention preferably includes a plurality of layers. Referring to FIGS. 6A–6D, the illustrated circuit board comprises four layers; namely, a first outer layer 80, a first inner layer 90 positioned below the layer 80, a second inner layer 100 positioned below the layer 90, and a second outer layer 110 disposed below the layer 100. The layers are preferably arranged in a respective parallel configuration. A plurality of electrical connections represented by circles are provided at each layer and the connections in each of the four layers are aligned with connections in each of the other three layers. For example, the fuse connections 81, 82 and 83 in the first outer layer 80 are aligned with the connections 91, 92 and 93 in the first inner layer 90, the connections 101, 102 and 103 in the second inner layer 100, and the connections 111, 112 and 113 in the second outer layer 110. The fuse connections 81–82 and 82–83 are referred to herein as "input sockets" and "output sockets", respectively. The four layers and the connections are effectively spaced with respect to each other to prevent relative interference and comply with UL and CSA dielectric requirements.

Figure 6A:
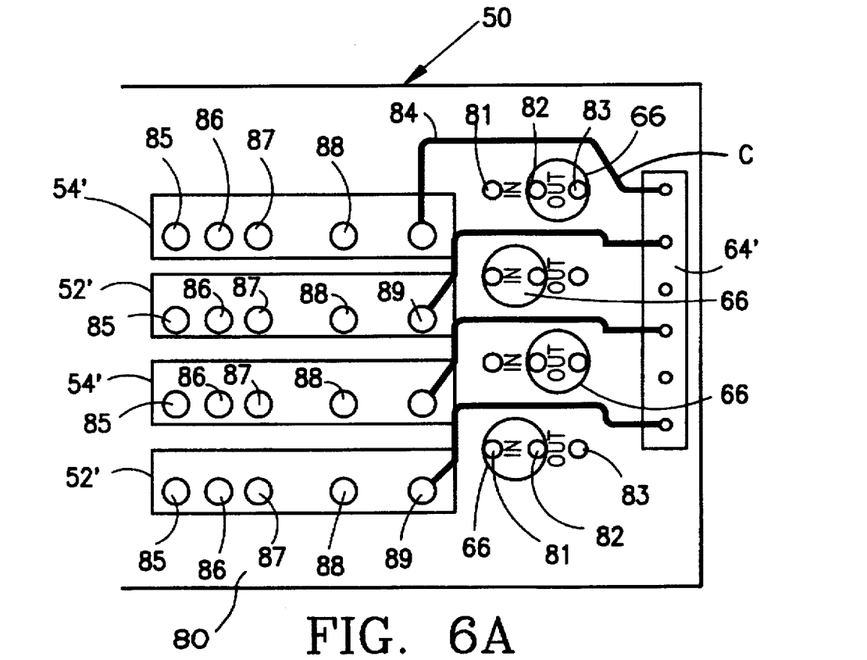
FIGS. 6A–6D are each top plan views illustrating the arrangement of the wiring connections and wiring of the four layers of the I/O circuit board in accordance with a preferred embodiment of the invention.

Referring to FIG. 6A, five connections 85–89 are provided for each input and output module position. These groups of five connections are referred to herein as "receptacles." Two electrical circuits "C" for each input module position 52' and output module position 54' are disposed on the first outer layer 80 and the second outer layer 110 as represented by bold lines. The fuses 66 are mounted to selected input and output sockets. For the output module positions 54', the fuses 66 are mounted in the fuse sockets 82 and 83 as represented by "out", and for the input module positions 52', the fuses 66 are mounted in the fuse sockets 81 and 82 as represented by "in". A fuse is moved from an input to an output position, for example, simply by removing it from an input socket and plugging it into an output sockets.

Figure 6B:
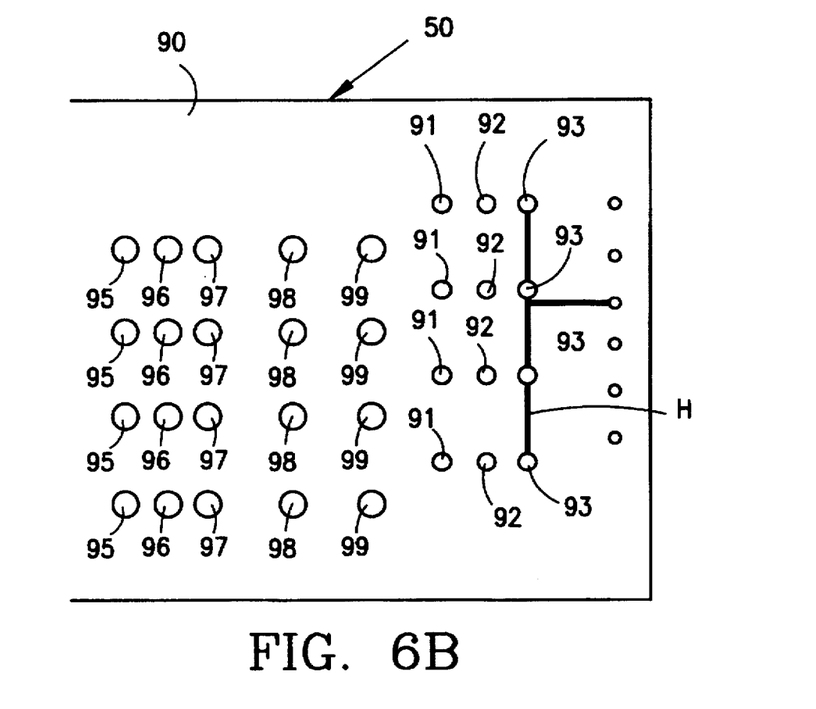
Figure 6C:
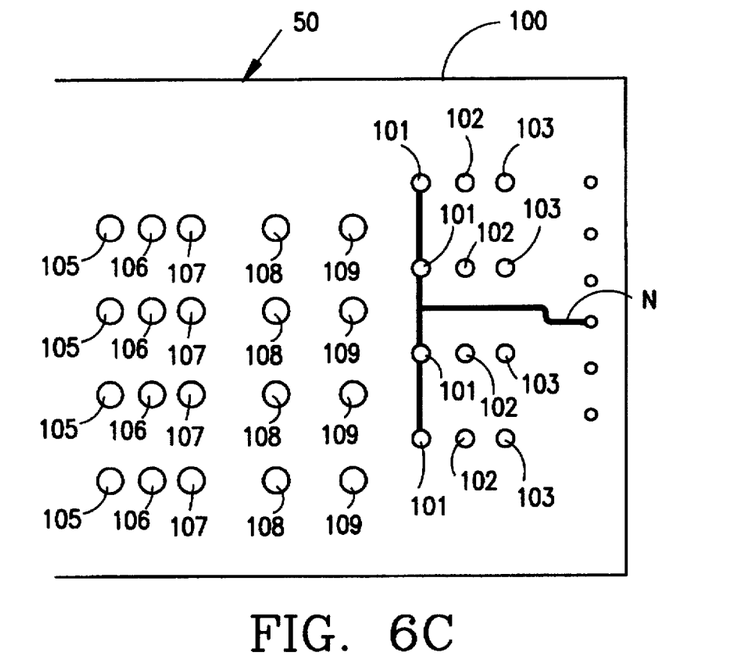
Figure 6D:
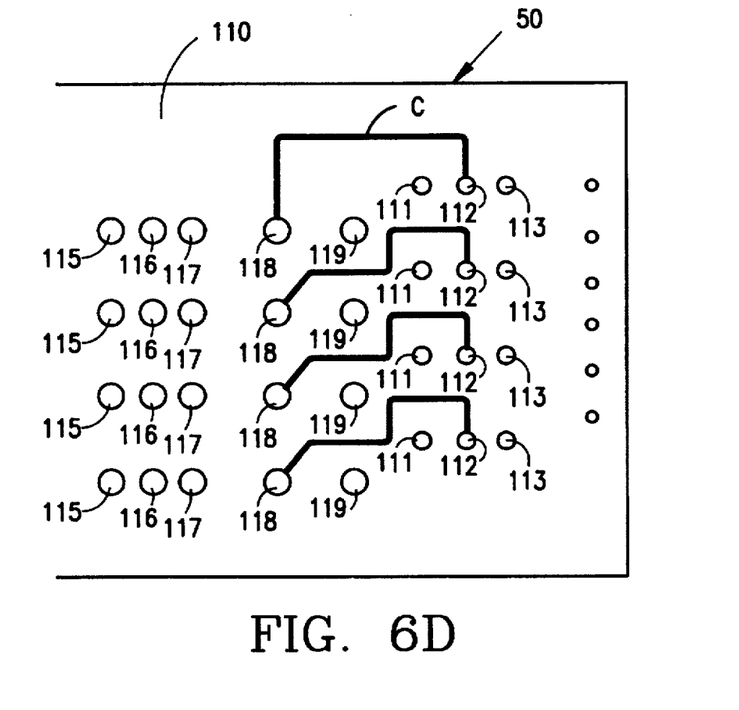

Referring to FIGS. 6B and 6C, the hot "H" and neutral "N" circuits of the circuit board 50 are provided in the first inner layer 90 and the second inner layer 100, respectively, and extend to the connections 91, 92, 93, and 101, 102, 103, respectively. The hot and neutral circuits may optionally be provided in the opposite inner layer, for example, in the second inner layer 100 and the first inner layer 90, respectively.

The I/O circuit board in accordance with the invention may optionally have other numbers of layers and configurations including, for example, multi-wire, wire-wrap, screened and etched.

The foregoing description of the preferred embodiment of the invention has been presented to illustrate the principles of the invention and not to limit the invention to the particular embodiment illustrated. It is intended that the scope of the invention be defined by all of the embodiments encompassed within the following claims and their equivalents.

What is claimed is:

1. A digital input/output circuit board for selectively electrically connecting a plurality of field devices to a computer through input modules or receive outputs from the computer through output modules, the input/output circuit board comprising:

a plurality of module receptacles, each said module receptacle being adapted to selectively receive an input module or an output module, said module receptacles being electrically connectible to a computer;

a plurality of field wiring terminals being adapted for attaching field wires to electrically connect said module receptacles to the plurality of field devices;

a hot wire terminal for attaching a hot power wire;

a neutral wire terminal for attaching a neutral power wire; and a plurality of selecting means electrically connected to said plurality of said module receptacles for selecting the status of each of said module receptacles as being an input or an output, each of said selecting means including an input position and an output position for each of said module receptacles.

2. The circuit board of claim 1, wherein each of said input and output positions includes an input socket and an output socket respectively; and a plurality of fuses, each of said fuses being selectively insertable in one of said input sockets to electrically connect an input module mounted within one of said plurality of module receptacles to one of the field devices through one of said plurality of field wiring terminals to thereby enable a computer to be electrically connected to the circuit board to receive an input signal indicating a state of said one of the field devices, and each of said fuses being removable from said one of said input sockets and insertable in one of said output sockets to electrically connect an output module mounted within said one of said plurality of module receptacles to a second one of the field devices to enable a computer to be electrically connected to the circuit board to send an output signal to thereby activate the second one of the field devices.

3. The circuit board of claim 1, wherein a separate field wiring terminal is electrically connected to each of said module receptacles.

4. The circuit board of claim 2, wherein a separate field wiring terminal is electrically connected to each of said module receptacles.

5. The circuit board of claim 1, comprising first and second outer layers and first and second inner layers disposed between said first and second outer layers.

6. The circuit board of claim 2, comprising first and second outer layers and first and second inner layers disposed between said first and second outer layers.

7. The circuit board of claim 5, wherein said module receptacles and said input and output positions are provided on said first and second outer layers, and said hot wire terminal and said neutral wire terminal are provided on said first and second inner layers.

8. The circuit board of claim 6, wherein said module receptacles and said input and output sockets are provided on said first and second outer layers, and said hot wire terminal and said neutral wire terminal are provided on said first and second inner layers.

9. A digital input/output circuit board, comprising:

first and second outer layers and first and second inner layers disposed between said first and second outer layers, a plurality of module receptacles, said module receptacles being adapted to be electrically connectible to a computer;

at least one input module and at least one output module, each said input module and output module being selectively mountable to a module receptacle;

a plurality of field wiring terminals for attaching field wires to electrically connect the circuit board to field devices;

a hot wire terminal for attaching a hot power wire;

a neutral wire terminal for attaching a neutral power wire;

selecting means for selecting the status of each of said module receptacles as being an input or an output, said selecting means including a plurality of input sockets and a plurality of output sockets, an input socket and an output socket being provided for each of said plurality of module receptacles, and a plurality of fuses, each of said fuses being selectively insertable in an input socket to electrically connect an input module to a first field device to enable a computer to be electrically connected to the circuit board to receive an input signal indicating the state of said first field device, and said fuses each being removable from said input socket and insertable in an output socket to electrically connect an output module to a second field device to enable a computer to be electrically connected to the circuit board to send an output signal to activate said second field device.

10. The circuit board of claim 9, a separate field wiring terminal electronically connected to each of said module receptacles.

11. The circuit board of claim 9, wherein said module receptacles and said input and output sockets are provided on said first and second outer layers, and said hot wire terminal and said neutral wire terminal are provided on said first and second inner layers.

12. A digital input/output circuit board for selectively electrically connecting a plurality of field devices to a computer through input modules or receive outputs from the computer through output modules, the input/output circuit board comprising:

a plurality of module receptacles, each said module receptacle being adapted to selectively receive an input module or an output module, said module receptacles being electrically connectible to a computer;

a plurality of field wiring terminals being adapted for attaching field wires to electrically connect said module receptacles to the plurality of field devices;

a hot wire terminal for attaching a hot power wire;

a neutral wire terminal for attaching a neutral power wire; and a plurality of fuse means electrically connected to said plurality of said module receptacles for selecting the status of each of said module receptacles as being an input or an output, each of said fuse means being moveable between an input position and an output position for each of said module receptacles.

* * * * *